(12) United States Patent
Yu et al.

(10) Patent No.: US 12,046,500 B2
(45) Date of Patent: Jul. 23, 2024

(54) TRANSPORT APPARATUS AND SUBSTRATE PROCESSING APPARATUS

(71) Applicant: EBARA CORPORATION, Tokyo (JP)

(72) Inventors: Hao Yu, Tokyo (JP); Mitsuru Miyazaki, Tokyo (JP); Takuya Inoue, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 132 days.

(21) Appl. No.: 17/832,677

(22) Filed: Jun. 5, 2022

(65) Prior Publication Data
US 2023/0005773 A1 Jan. 5, 2023

(30) Foreign Application Priority Data

Jun. 30, 2021 (JP) .................................. 2021-109455

(51) Int. Cl.
| | | |
|---|---|---|
| *H01L 21/677* | (2006.01) | |
| *C23C 16/455* | (2006.01) | |
| *H01L 21/67* | (2006.01) | |
| *H01L 21/687* | (2006.01) | |

(52) U.S. Cl.
CPC .. *H01L 21/67742* (2013.01); *C23C 16/45519* (2013.01); *H01L 21/67034* (2013.01); *H01L 21/67219* (2013.01); *H01L 21/68764* (2013.01)

(58) Field of Classification Search
None
See application file for complete search history.

(56) References Cited

U.S. PATENT DOCUMENTS

| | | |
|---|---|---|
| 2015/0128441 A1 | 5/2015 | Segawa et al. |
| 2016/0099156 A1 | 4/2016 | Yamaguchi et al. |
| 2021/0327737 A1 | 10/2021 | Sakata et al. |

FOREIGN PATENT DOCUMENTS

| | | | |
|---|---|---|---|
| JP | 2003092335 | 3/2003 | |
| JP | 2010050436 | 3/2010 | |
| JP | 2013247283 | 12/2013 | |
| JP | 2015095526 | 5/2015 | |
| WO | WO-2019155842 A1 * | 8/2019 | .............. B25J 15/08 |

* cited by examiner

*Primary Examiner* — Rodney E Fuller
(74) *Attorney, Agent, or Firm* — JCIPRNET

(57) ABSTRACT

A transport apparatus includes a hand, a drive mechanism, a cover member, and a gas supply member. The hand is configured to hold a wafer. The drive mechanism is configured to transport the wafer by moving the hand. The cover member has an opposing surface opposed to a surface of the wafer held by the hand and is formed with a plurality of holes opened in the opposing surface. The gas supply member is configured to supply an inert gas to the surface of the wafer via the plurality of holes of the cover member. The plurality of holes are formed in the opposing surface so that an opening ratio of an outer peripheral portion of the opposing surface is higher than an opening ratio of a central portion of the opposing surface.

7 Claims, 8 Drawing Sheets

TRANSPORT APPARATUS AND SUBSTRATE PROCESSING APPARATUS

CROSS-REFERENCE TO RELATED APPLICATION

This application claims the priority benefit of Japan application serial no. 2021-109455, filed on Jun. 30, 2021. The entirety of the above-mentioned patent application is hereby incorporated by reference herein and made a part of this specification.

BACKGROUND

Technical Field

The disclosure relates to a transport apparatus and a substrate processing apparatus.

Related Art

In recent years, a substrate processing apparatus has been used to perform various processes on a substrate such as a semiconductor wafer. An example of the substrate processing apparatus is a CMP (chemical mechanical polishing) apparatus for performing a polishing process and the like on a substrate.

The CMP apparatus includes a polishing apparatus for polishing a substrate, a cleaning apparatus for cleaning and drying a substrate, a load/unload apparatus which transfers a substrate to the polishing apparatus and receives the substrate that has been cleaned and dried by the cleaning apparatus, etc. Further, the CMP apparatus includes a transport apparatus for transporting a substrate in the polishing apparatus, the cleaning apparatus, and the load/unload apparatus. The CMP apparatus sequentially performs various processes of polishing, cleaning, and drying while transporting the substrate by the transport apparatus.

In the CMP apparatus, the substrate is exposed to air, and moisture and oxygen adhere to the surface of the substrate, which causes oxidation and corrosion. In this regard, as disclosed in Patent Document 1 (Japanese Patent Application Laid-Open No. 2015-95526), the substrate held by the hand is covered with a cover, and by supplying nitrogen gas from the cover, the air on the surface of the substrate is replaced with nitrogen gas.

However, the conventional art does not consider suppressing the supply amount of inert gas to efficiently suppress oxidation and corrosion of the substrate.

That is, in the technique disclosed in Patent Document 1, the inert gas is supplied from the cover to the entire surface of the substrate. In this case, if the substrate held by the hand is stationary, the air on the surface of the substrate can be replaced with the inert gas by supplying a small amount of the inert gas. In contrast, when the substrate is moved in a direction along the surface of the substrate, e.g., when the transport apparatus turns while the hand holds the substrate, the inert gas supplied from the cover is replaced by the air in the moving direction, and the oxygen concentration on the surface of the substrate tends to increase. In this regard, it is conceivable to supply a large amount of inert gas so that the inert gas on the surface of the substrate is not replaced by air; however, when a large amount of inert gas is supplied to the entire surface of the substrate, it is not preferable because the liquid film formed on the substrate surface may be blown off, which may instead lead to oxidation and corrosion of the substrate surface.

SUMMARY

According to an embodiment, a transport apparatus includes a hand, a drive mechanism, a cover member, and a gas supply member. The hand is configured to hold a substrate. The drive mechanism is configured to transport the substrate by moving the hand. The cover member has an opposing surface opposed to a surface of the substrate held by the hand and is formed with a plurality of holes opened in the opposing surface. The gas supply member is configured to supply an inert gas to the surface of the substrate via the plurality of holes of the cover member. The plurality of holes are formed in the opposing surface so that an opening ratio of an outer peripheral portion of the opposing surface is higher than an opening ratio of a central portion of the opposing surface.

DESCRIPTION OF THE EMBODIMENTS

Figure 1:
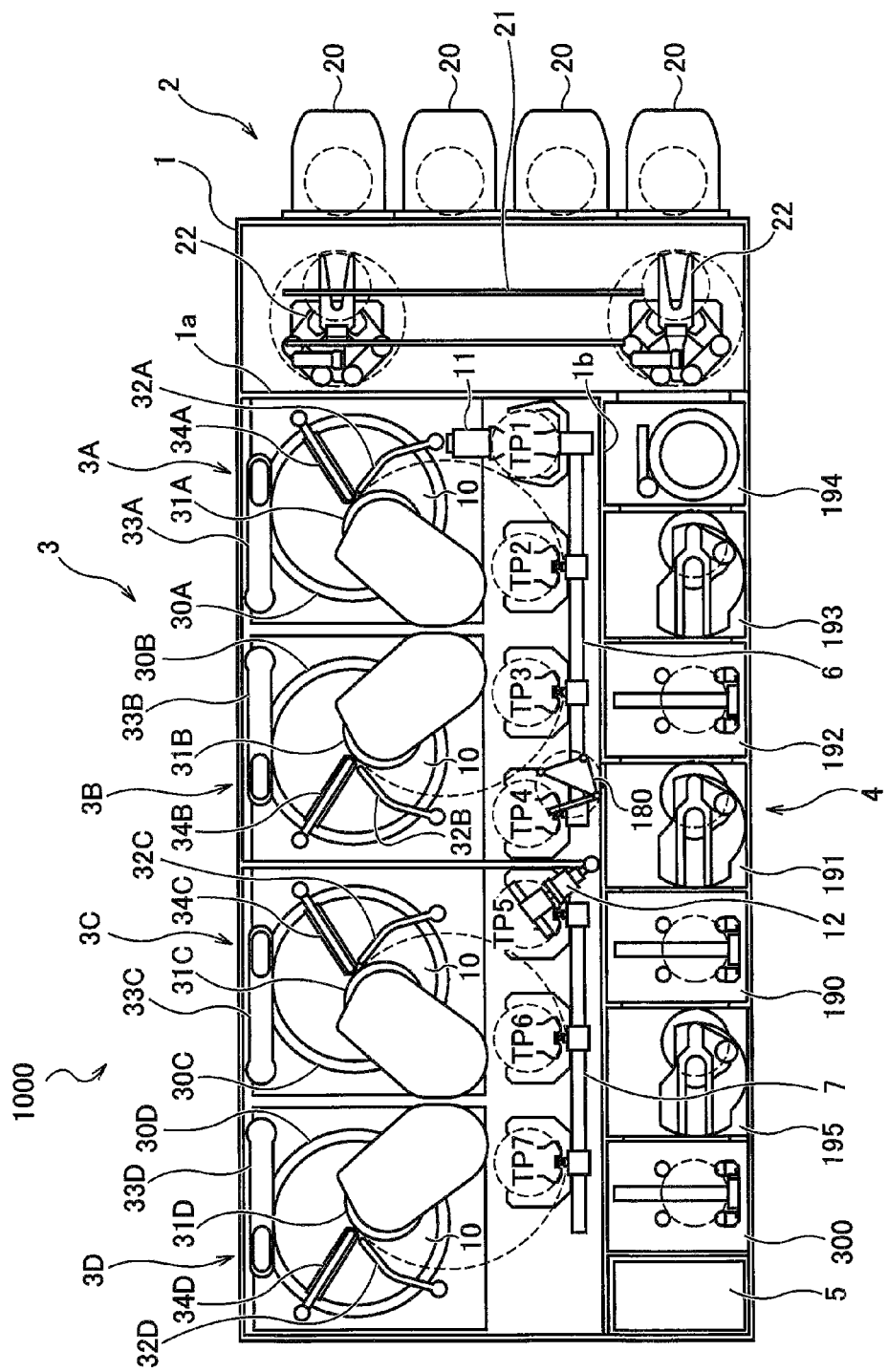
FIG. 1 is a plan view showing an overall configuration of a CMP apparatus serving as an example of a substrate processing apparatus according to an embodiment of the disclosure.

Embodiments of the disclosure suppress the supply amount of inert gas to efficiently suppress oxidation and corrosion of the substrate.

Hereinafter, a transport apparatus and a substrate processing apparatus according to an embodiment of the disclosure will be described with reference to the drawings. In the drawings described below, the same or corresponding components will be labeled with the same reference signs and repeated descriptions will be omitted.

<Polishing Apparatus>

FIG. 1 is a plan view showing an overall configuration of a CMP apparatus serving as an example of a substrate processing apparatus according to an embodiment of the disclosure. As shown in FIG. 1, a CMP apparatus 1000 includes a housing 1 in a substantially rectangular shape. The inside of the housing 1 is divided into a load/unload apparatus 2, a polishing apparatus 3, and a cleaning apparatus 4 by partition walls 1a and 1b. The load/unload apparatus 2, the polishing apparatus 3, and the cleaning apparatus 4 are assembled independently and exhausted independently. Further, the cleaning apparatus 4 includes a power supply member which supplies power to the polishing apparatus and a control device 5 which controls the processing operation.

<Load/Unload Apparatus>

The load/unload apparatus 2 includes two or more (four in this embodiment) front load members 20 on which a wafer cassette for stocking a large number of objects to be processed (e.g., a disk-shaped wafer (substrate)) is placed. These front load members 20 are arranged adjacent to the housing 1 along a width direction (a direction perpendicular to a longitudinal direction) of the polishing apparatus. An open cassette, a standard manufacturing interface (SMIF) pod, or a front opening unified pod (FOUP) may be mounted on the front load member 20. Herein, the SMIF and the FOUP are closed containers which accommodate a wafer cassette therein and can maintain an environment independent of the external space by covering with a partition wall.

Further, in the load/unload apparatus 2, a traveling mechanism 21 is laid along the row of the front load members 20. Two transport robots (loaders, transport mechanisms) 22 capable of moving along the arrangement direction of the wafer cassettes are installed on the traveling mechanism 21. The transport robot 22 may access the wafer cassette mounted on the front load member 20 by moving on the traveling mechanism 21. Each transport robot 22 includes two (i.e., upper and lower) hands. The upper hand is used to return a processed wafer to the wafer cassette. The lower hand is used to take out a to-be-processed wafer from the wafer cassette. In this manner, the upper and lower hands can be properly used. Further, the lower hand of the transport robot 22 is configured to be capable of inverting a wafer.

<Polishing Apparatus>

The polishing apparatus 3 is a region where polishing (planarization) of a wafer is performed. The polishing apparatus 3 includes a first polishing apparatus 3A, a second polishing apparatus 3B, a third polishing apparatus 3C, and a fourth polishing apparatus 3D. As shown in FIG. 1, the first polishing apparatus 3A, the second polishing apparatus 3B, the third polishing apparatus 3C, and the fourth polishing apparatus 3D are arranged along a longitudinal direction of the polishing apparatus.

As shown in FIG. 1, the first polishing apparatus 3A includes a polishing table 30A to which a polishing pad (polishing tool) 10 having a polishing surface is attached, a top ring 31A for holding and pressing the wafer against the polishing pad 10 on the polishing table 30A to polish the wafer, a polishing liquid supply nozzle 32A for supplying a polishing liquid or a dressing liquid (e.g., pure water) to the polishing pad 10, a dresser 33A for dressing the polishing surface of the polishing pad 10, and an atomizer 34A which sprays a mixed fluid of a liquid (e.g., pure water) and a gas (e.g., nitrogen gas) or a liquid (e.g., pure water) to remove slurry or polishing products on the polishing surface, and polishing pad residue produced due to dressing.

Similarly, the second polishing apparatus 3B includes a polishing table 30B, a top ring 31B, a polishing liquid supply nozzle 32B, a dresser 33B, and an atomizer 34B. The third polishing apparatus 3C includes a polishing table 30C, a top ring 31C, a polishing liquid supply nozzle 32C, a dresser 33C, and an atomizer 34C. The fourth polishing apparatus 3D includes a polishing table 30D, a top ring 31D, a polishing liquid supply nozzle 32D, a dresser 33D, and an atomizer 34D.

Since the first polishing apparatus 3A, the second polishing apparatus 3B, the third polishing apparatus 3C, and the fourth polishing apparatus 3D have the same configuration, hereinafter, only the first polishing apparatus 3A will be described.

Figure 2:
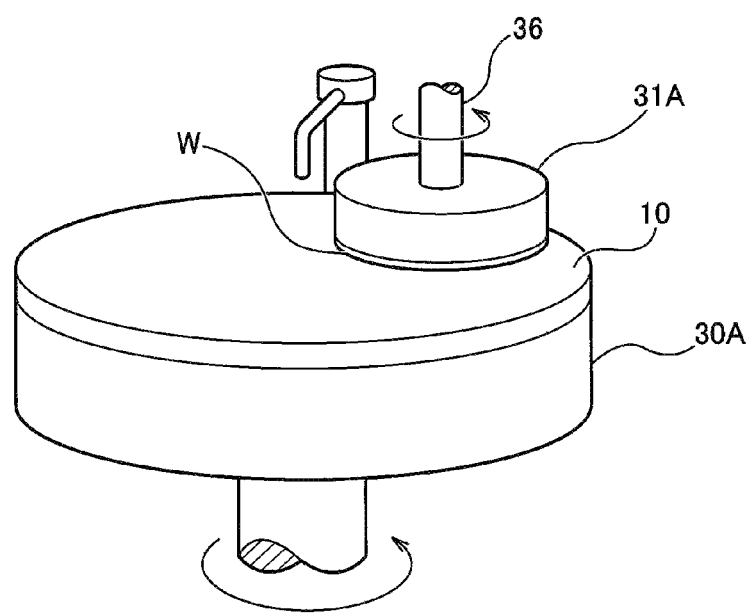
FIG. 2 is a perspective view schematically showing a polishing apparatus.

FIG. 2 is a perspective view schematically showing the first polishing apparatus 3A. The top ring 31A is supported by a top ring shaft 36. The polishing pad 10 is attached to the upper surface of the polishing table 30A. The upper surface of the polishing pad 10 forms a polishing surface for polishing a wafer W. Fixed abrasive grains may also be used instead of the polishing pad 10. The top ring 31A and the polishing table 30A are configured to rotate on their axes, as indicated by arrows. The wafer W is held to the lower surface of the top ring 31A by vacuum suction. At the time of polishing, with the polishing liquid supplied from the polishing liquid supply nozzle 32A to the polishing surface of the polishing pad 10, the wafer W, i.e., the object to be polished, is pressed against the polishing surface of the polishing pad 10 by the top ring 31A and is polished.

<Transport Mechanism>

Next, a transport mechanism for transporting the wafer will be described. As shown in FIG. 1, a first linear transporter 6 is arranged adjacent to the first polishing apparatus 3A and the second polishing apparatus 3B. The first linear transporter 6 is a mechanism for transporting a wafer between four transport positions (a first transport position TP1, a second transport position TP2, a third transport position TP3, and a fourth transport position TP4, sequentially from the load/unload apparatus side) along the arrangement direction of the polishing apparatuses 3A and 3B.

Further, a second linear transporter 7 is arranged adjacent to the third polishing apparatus 3C and the fourth polishing apparatus 3D. The second linear transporter 7 is a mechanism for transporting a wafer between three transport positions (a fifth transport position TP5, a sixth transport position TP6, and a seventh transport position TP7, sequentially from the load/unload apparatus side) along the arrangement direction of the polishing apparatuses 3C and 3D.

The wafer is transported to the polishing apparatuses 3A and 3B by the first linear transporter 6. The top ring 31A of the first polishing apparatus 3A moves between the polishing position and the second transport position TP2 by the swing operation of a top ring head. Therefore, the transfer of the wafer to the top ring 31A is performed at the second transport position TP2. Similarly, the top ring 31B of the second polishing apparatus 3B moves between the polishing position and the third transport position TP3, and the transfer of the wafer to the top ring 31B is performed at the third transport position TP3. The top ring 31C of the third polishing apparatus 3C moves between the polishing position and the sixth transport position TP6, and the transfer of the wafer to the top ring 31C is performed at the sixth transport position TP6. The top ring 31D of the fourth polishing apparatus 3D moves between the polishing position and the seventh transport position TP7, and the transfer of the wafer to the top ring 31D is performed at the seventh transport position TP7.

A lifter 11 for receiving a wafer from the transport robot 22 is arranged at the first transport position TP1. The wafer is transferred from the transport robot 22 to the first linear transporter 6 via the lifter 11. A shutter (not shown) is provided in the partition wall 1a between the lifter 11 and the transport robot 22, and during transport of the wafer, the shutter is opened so that the wafer is transferred from the transport robot 22 to the lifter 11. Further, a swing transporter 12 is arranged between the first linear transporter 6, the second linear transporter 7, and the cleaning apparatus 4. The swing transporter 12 has a hand capable of moving between the fourth transport position TP4 and the fifth transport position TP5. The transfer of the wafer from the first linear transporter 6 to the second linear transporter 7 is performed by the swing transporter 12. The wafer is transported by the second linear transporter 7 to the third polishing apparatus 3C and/or the fourth polishing apparatus 3D. Further, the wafer polished by the polishing apparatus 3 is transported to the cleaning apparatus 4 via the swing transporter 12.

The first linear transporter 6 and the second linear transporter 7 each has a plurality of transport stages (not shown), as described in Japanese Patent Application Laid-Open No. 2010-50436. Accordingly, for example, it is possible to use a transport stage for transporting an unpolished wafer to each transport position and use a transport stage for transporting a polished wafer from each transport position. As a result, it is possible to promptly transport the wafer to the transport position to start polishing, and prompt send the polished wafer to the cleaning apparatus.

<Cleaning Apparatus>

Figure 3A:
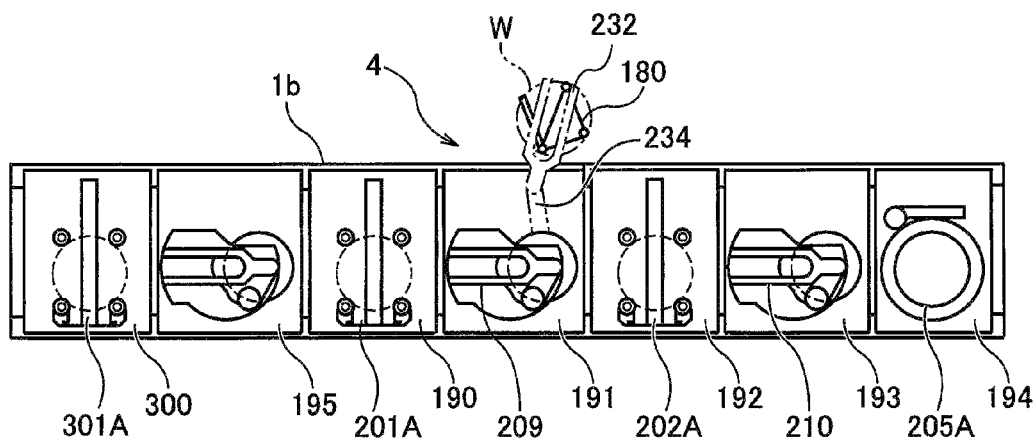
FIG. 3A and FIG. 3B are a plan view and a side view schematically showing the configuration of a cleaning apparatus.
Figure 3B:
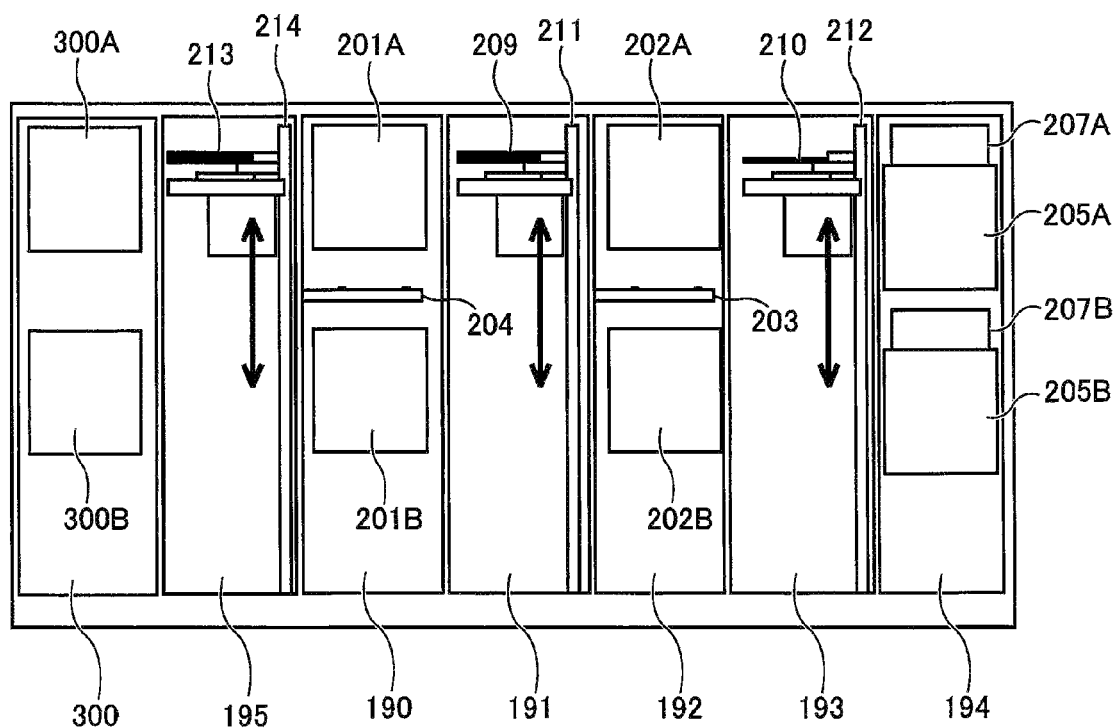

FIG. 3A and FIG. 3B are a plan view and a side view schematically showing the configuration of the cleaning apparatus. FIG. 3A is a plan view showing the cleaning apparatus 4, and FIG. 3B is a side view showing the cleaning apparatus 4. As shown in FIG. 3A and FIG. 3B, the cleaning apparatus 4 is divided into roll cleaning chambers 190 and 300, a first transport chamber 191, a pen cleaning chamber 192, a second transport chamber 193, a drying chamber 194, and a third transport chamber 195.

In the roll cleaning chamber 190, an upper roll cleaning module 201A and a lower roll cleaning module 201B are arranged along the vertical direction. The upper roll cleaning module 201A is arranged above the lower roll cleaning module 201B. The upper roll cleaning module 201A and the lower roll cleaning module 201B are cleaning machines which clean a wafer by pressing two rotating roll sponges respectively against the front and back surfaces of the wafer while supplying a cleaning liquid to the front and back surfaces of the wafer. A temporary placement table 204 for the wafer is provided between the upper roll cleaning module 201A and the lower roll cleaning module 201B. Similar to the upper roll cleaning module 201A and the lower roll cleaning module 201B arranged in the roll cleaning chamber 190, an upper roll cleaning module 300A and a lower roll cleaning module 300B are arranged in the roll cleaning chamber 300.

In the pen cleaning chamber 192, an upper pen cleaning module 202A and a lower pen cleaning module 202B are arranged along the vertical direction. The upper pen cleaning module 202A is arranged above the lower pen cleaning module 202B. The upper pen cleaning module 202A and the lower pen cleaning module 202B are cleaning machines which clean a wafer by pressing a rotating pencil sponge against the surface of the wafer and swinging it in a radial direction of the wafer while supplying a cleaning liquid to the surface of the wafer. A temporary placement table 203 for the wafer is provided between the upper pen cleaning module 202A and the lower pen cleaning module 202B. A temporary placement table 180 for the wafer W is installed on a frame (not shown) and is arranged on the side of the swing transporter 12. The temporary placement table 180 is arranged adjacent to the first linear transporter 6 and is located between the first linear transporter 6 and the cleaning apparatus 4.

In the drying chamber 194, an upper drying module 205A and a lower drying module 205B are arranged along the vertical direction. The upper drying module 205A and the lower drying module 205B are isolated from each other. Filter fan devices 207A and 207B which respectively supply clean air into the drying modules 205A and 205B are provided at the upper parts of the upper drying module 205A and the lower drying module 205B.

A first transport apparatus 209 capable of moving up and down is arranged in the first transport chamber 191. A second transport apparatus 210 capable of moving up and down is arranged in the second transport chamber 193. A third transport apparatus 213 capable of moving up and down is arranged in the third transport chamber 195. The first transport apparatus 209, the second transport apparatus 210, and the third transport apparatus 213 are respectively movably supported by support shafts 211, 212, and 214 extending in the vertical direction. The first transport apparatus 209, the second transport apparatus 210, and the third transport apparatus 213 include therein an elevating drive mechanism such as a motor and is movable up and down along the support shafts 211, 212, and 214. Similar to the transport robot 22, the first transport apparatus 209 has two (i.e., upper and lower) hands. As shown by dotted lines in FIG. 3A, the first transport apparatus 209 is arranged at a position where the lower hand can access the temporary placement table 180 described above. When the lower hand of the first transport apparatus 209 accesses the temporary placement table 180, a shutter (not shown) provided in the partition wall 1b is opened.

The first transport apparatus 209 operates to transport the wafer W between the temporary placement table 180, the upper roll cleaning module 201A, the lower roll cleaning module 201B, the temporary placement table 204, the temporary placement table 203, the upper pen cleaning module 202A, and the lower pen cleaning module 202B. The first transport apparatus 209 uses the lower hand when transporting a to-be-cleaned wafer (a wafer with slurry attached thereon) and uses the upper hand when transporting a cleaned wafer.

The second transport apparatus 210 operates to transport the wafer W between the upper pen cleaning module 202A, the lower pen cleaning module 202B, the temporary placement table 203, the upper drying module 205A, and the lower drying module 205B. The second transport apparatus 210 only transports a cleaned wafer, and thus includes only one hand. The transport robot 22 shown in FIG. 1 uses the upper hand to take out the wafer from the upper drying module 205A or the lower drying module 205B and return the wafer to the wafer cassette. When the upper hand of the transport robot 22 accesses the drying modules 205A and 205B, a shutter (not shown) provided in the partition wall 1a is opened.

The third transport apparatus 213 operates to transport the wafer W between the upper roll cleaning module 300A, the lower roll cleaning module 300B, and the temporary placement table 204. The third transport apparatus 213 uses the lower hand when transporting a to-be-cleaned wafer (a wafer with slurry attached thereon) and uses the upper hand when transporting a cleaned wafer.

Next, the transport at the time when a wafer that has been polished by the polishing apparatus 3 is processed in a sequence of cleaning with a roll sponge, cleaning with a pencil sponge, and drying will be described.

First, the lower hand of the first transport apparatus 209 receives the wafer W from the temporary placement table 180. The lower hand of the first transport apparatus 209 transports the wafer W to the upper roll cleaning module 201A, the lower roll cleaning module 201B, or the temporary placement table 204. When the wafer W has been placed on the temporary placement table 204, the lower hand of the third transport apparatus 213 transports the wafer W to the upper roll cleaning module 300A or the lower roll cleaning module 300B. When roll cleaning has been performed by the upper roll cleaning module 300A or the lower roll cleaning module 300B, the upper hand of the third transport apparatus 213 transports the wafer W to the temporary placement table 204. The upper hand of the first transport apparatus 209 receives the roll-cleaned wafer W from the upper roll cleaning module 201A, the lower roll cleaning module 201B, or the temporary placement table 204, and transports the wafer W to the upper pen cleaning module 202A or the lower pen cleaning module 202B. The second transport apparatus 210 receives the pen-cleaned wafer W from the upper pen cleaning module 202A or the lower pen cleaning module 202B, and transports the wafer W to the upper drying module 205A or the lower drying module 205B. The transport route of the wafer W shown herein is an example and the disclosure is not limited to this transport route. For example, when drying is performed after roll cleaning without pen cleaning, the temporary placement table 203 may be used as a transfer table for the wafer W from the first transport chamber 191 to the second transport chamber 193. When not required, the temporary placement table 203 may not be provided.

In the CMP apparatus 1000, it is important to suppress oxidation and corrosion of the surface of the wafer W. That is, when the wafer W is exposed to air, oxidation and corrosion may occur due to adhesion of moisture and oxygen to the surface of the wafer W. For this reason, the cleaning apparatus 4 takes measures for suppressing oxidation and corrosion of the surface of the wafer W in the roll cleaning chambers 190 and 300, the pen cleaning chamber 192, and the drying chamber 194. This point will be described below.

Figure 4:
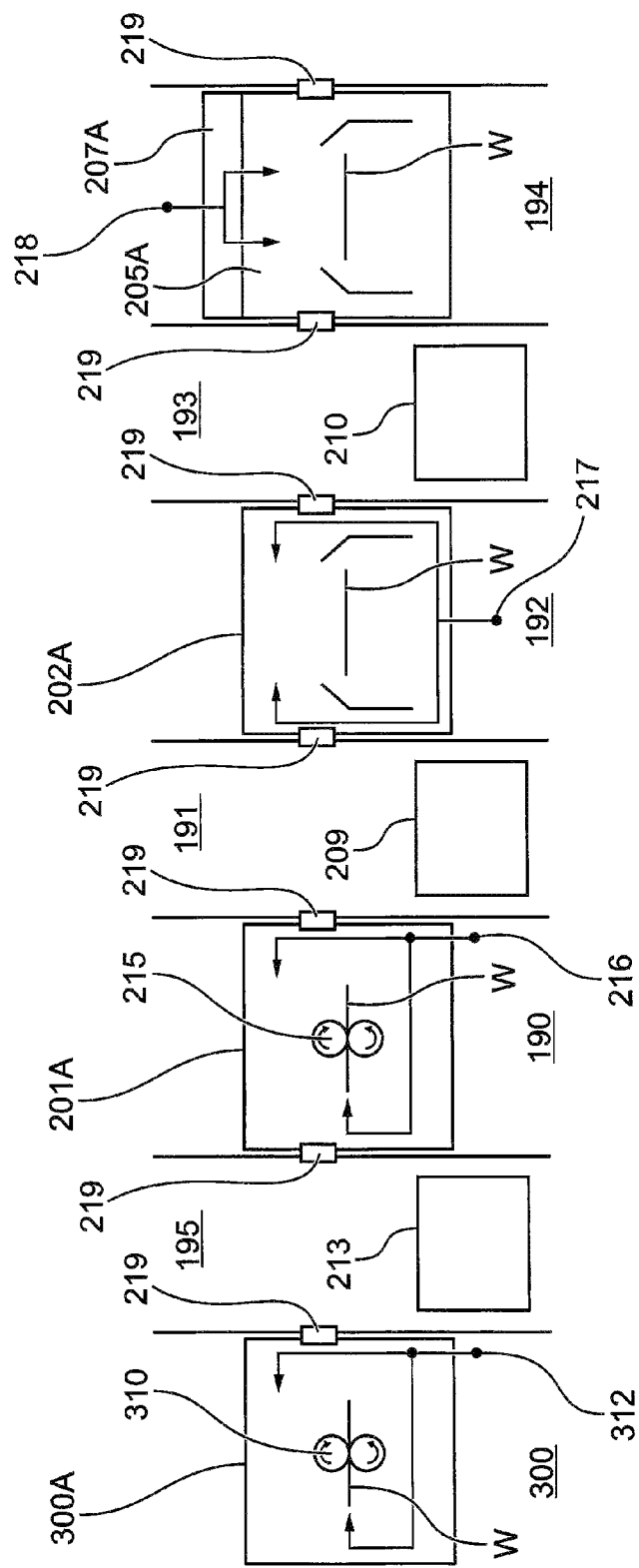
FIG. 4 is a side view schematically showing the configuration of the cleaning apparatus.

FIG. 4 is a side view schematically showing the configuration of the cleaning apparatus. In FIG. 4, for simplicity, only the upper roll cleaning module 300A is shown in the roll cleaning chamber 300, but the lower roll cleaning module 300B also has a similar configuration. Further, only a part of the modules are shown for the roll cleaning chamber 190, the pen cleaning chamber 192, and the drying chamber 194.

As shown in FIG. 4, the upper roll cleaning module 300A includes a gas supply member 312 for supplying an inert gas (e.g., nitrogen gas or argon gas) into the upper roll cleaning module 300A. The gas supply member 312 is configured to supply the inert gas in the horizontal direction in the upper part of the upper roll cleaning module 300A, and also supply the inert gas in a direction along the surface of the wafer W in a manner that a liquid film formed on the surface of the wafer W to be roll-cleaned by the roll sponge 310 is not removed.

Similarly, in the roll cleaning chamber 190, the upper roll cleaning module 201A includes a gas supply member 216 for supplying an inert gas in the horizontal direction into the upper roll cleaning module 201A. Further, the upper pen cleaning module 202A includes a gas supply member 217 for supplying an inert gas in the horizontal direction into the upper pen cleaning module 202A. Further, since it is possible not to consider the liquid film on the surface of the wafer W in the upper drying module 205A, the upper drying module 205A includes a gas supply member 218 for supplying an inert gas in a direction orthogonal to the surface of the wafer W. By providing the gas supply member 312, the gas supply member 216, the gas supply member 217, and the gas supply member 218, since the surface of the wafer W is replaced with the inert gas, oxidation and corrosion of the surface of the wafer W can be suppressed.

As shown in FIG. 4, a shutter 219 is provided between the roll cleaning chamber 300 and the third transport chamber 195. The shutter 219 is opened when the wafer W is transferred between the roll cleaning chamber 300 and the third transport chamber 195 and is closed when the wafer W is not transferred. A similar shutter 219 is also provided between other adjacent chambers, such as between the third transport chamber 195 and the roll cleaning chamber 190.

The cleaning apparatus 4 takes measures for suppressing oxidation and corrosion of the surface of the wafer W in the first transport apparatus 209, the second transport apparatus 210, and the third transport apparatus 213. Since the first transport apparatus 209, the second transport apparatus 210, and the third transport apparatus 213 have the same configuration with respect to the suppression of oxidation and corrosion of the surface of the wafer W, the configuration will be described below with reference to the first transport apparatus 209. The first transport apparatus 209 has two (i.e., upper and lower) hands, but since both have the same configuration, only one of them will be described.

Figure 5:
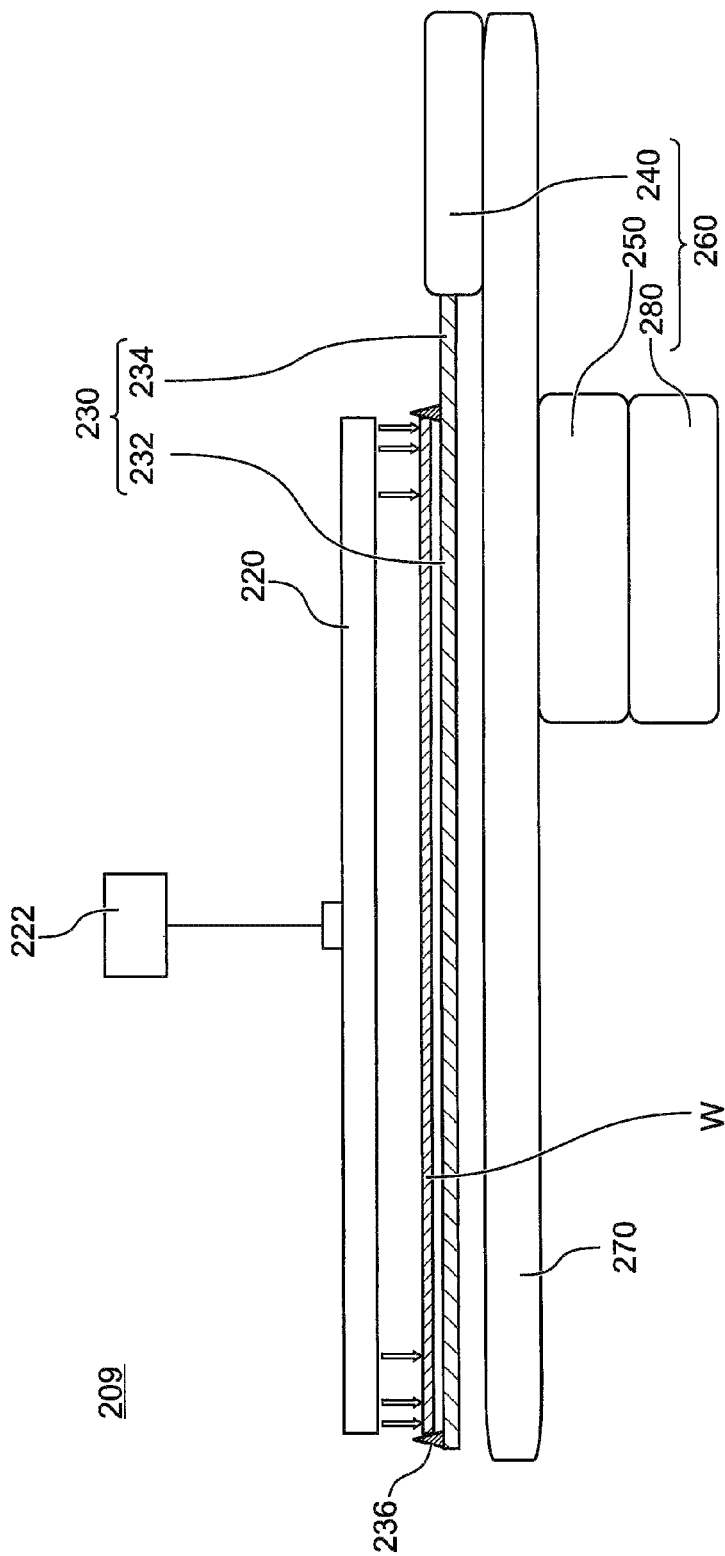
FIG. 5 is a side view schematically showing the configuration of a first transport apparatus.
Figure 6:
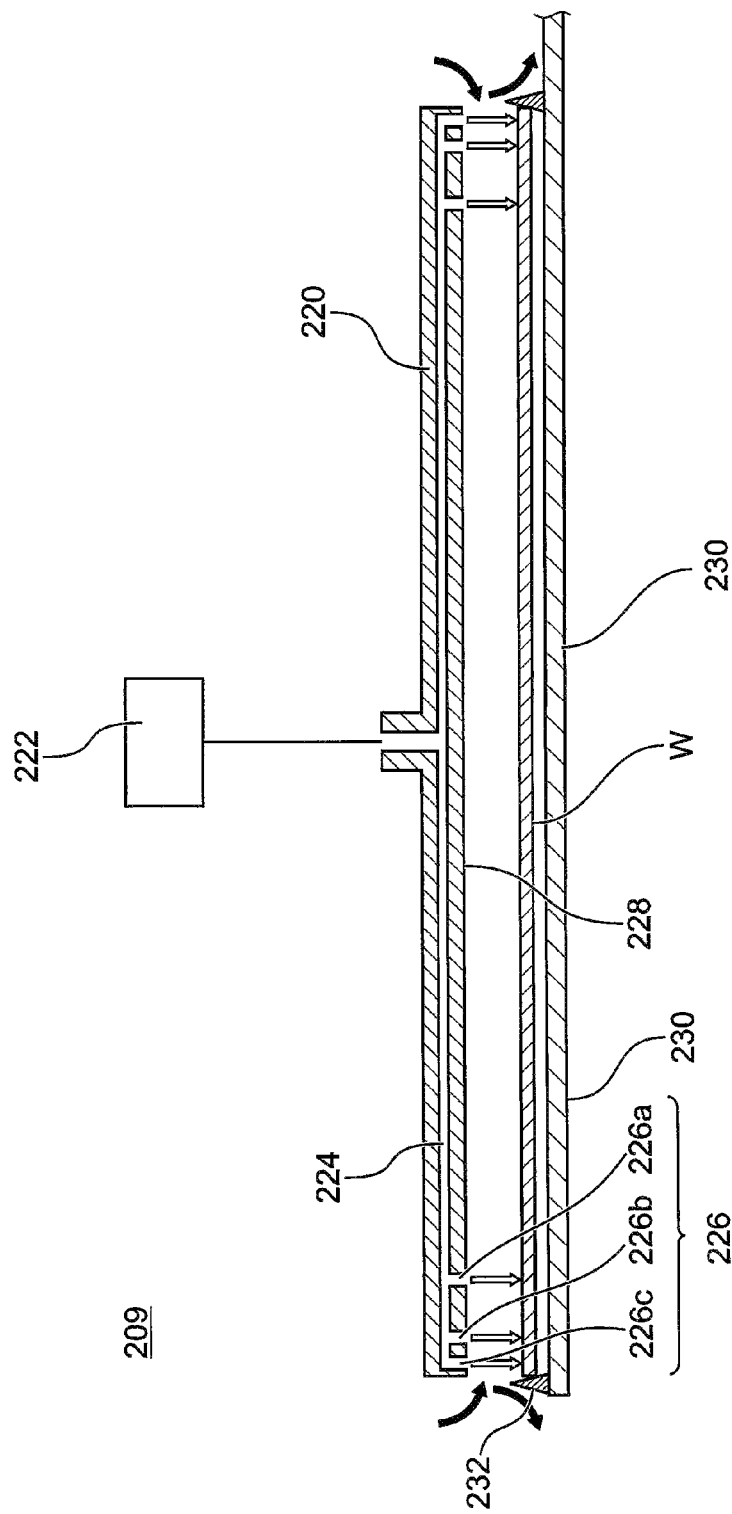
FIG. 6 is a view schematically showing protection of the surface of a wafer by supply of an inert gas.
Figure 7:
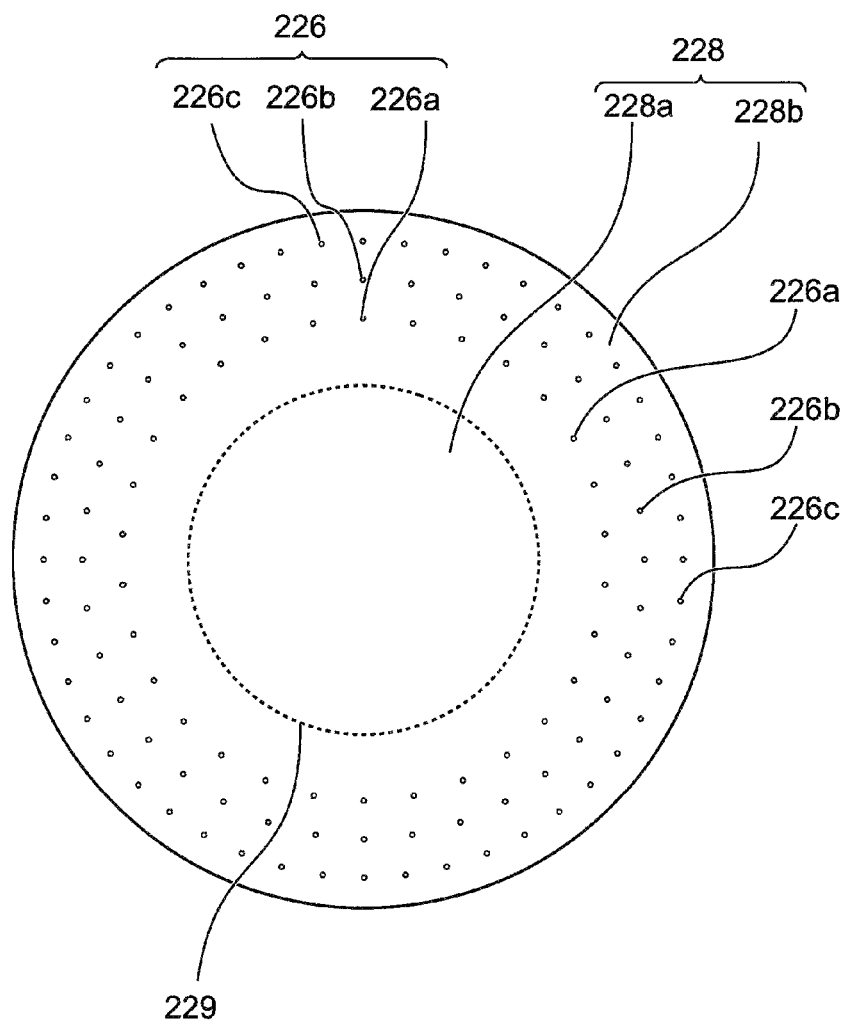
FIG. 7 is a view showing a plurality of holes formed in a cover member.

FIG. 5 is a side view schematically showing the configuration of the first transport apparatus. FIG. 6 is a view schematically showing protection of the surface of the wafer by supply of an inert gas. FIG. 7 is a view showing a plurality of holes formed in a cover member.

The first transport apparatus 209 includes a hand 230 configured to hold the wafer W. As shown in FIG. 3A, the hand 230 includes a hand body member 232 having a U-shape in a plan view, and an arm member 234 connected to the hand body member 232 and extending in the horizontal direction. As shown in FIG. 5, a plurality of (e.g., four) protruding claw members 236 are formed on the upper surface of the hand body member 232. The hand 230 is configured to hold the wafer W by supporting the outer edge of the wafer W by the plurality of claw members 236.

As shown in FIG. 5, the first transport apparatus 209 includes a base 270 configured to support the hand 230. Further, the first transport apparatus 209 includes a drive mechanism 260 configured to transport the wafer W by moving the hand 230. The drive mechanism 260 includes a horizontal drive mechanism 240 which moves the hand 230 horizontally with respect to the base 270 by expanding and contracting the arm member 234 in the horizontal direction. Further, the drive mechanism 260 includes a rotational drive mechanism 250 configured to rotate the base 270 (and the hand 230 supported by the base 270) to change the orientation of the hand 230 in a horizontal plane. Further, the drive mechanism 260 includes an elevating drive mechanism 280 for raising and lowering the base 270 (and the hand 230 supported by the base 270). The first transport apparatus 209 may move the hand 230 to a desired position by the drive mechanism 260.

As shown in FIG. 5, the first transport apparatus 209 includes a cover member 220 arranged opposed to the surface of the wafer W held by the hand 230. The cover member 220 is a disk-shaped member having an outer shape substantially equal to the outer shape of the wafer W. The cover member 220 has an opposing surface 228 opposed to the surface of the wafer W. The cover member 220 may be fixed to the hand 230 via a member such as a bracket (not shown). In this case, the cover member 220 is configured to move along with the horizontal movement of the hand 230 by the horizontal drive mechanism 240, the ascending and descending movement by the elevating drive mechanism 280, and the rotational movement by the rotational drive mechanism 250 while keeping the opposing surface 228 opposed to the surface of the wafer W. However, the disclosure is not limited thereto, and the cover member 220 may also be fixed to the base 270 via a member such as a bracket (not shown). In this case, the cover member 220 is configured to move along with the ascending and descending movement of the hand 230 by the elevating drive mechanism 280 and the rotational movement by the rotational drive mechanism 250 while keeping the opposing surface 228 opposed to the surface of the wafer W.

As shown in FIG. 6, a flow path 224 is formed inside the cover member 220. The opposing surface 228 is formed with a plurality of holes 226 which are opened in the opposing surface 228 and communicate with the flow path 224. In an example, the plurality of holes 226 are round holes formed in a direction orthogonal to the opposing surface 228, but the orientation and shape of the holes may also be arbitrary.

As shown in FIG. 5 and FIG. 6, the first transport apparatus 209 includes a gas supply member 222 configured to supply an inert gas (e.g., nitrogen gas or argon gas) to the surface of the wafer W via the flow path 224 and the plurality of holes 226 of the cover member 220.

As shown in FIG. 6 and FIG. 7, in this embodiment, the plurality of holes 226 are formed in the opposing surface 228 so that an opening ratio of an outer peripheral portion 228b of the opposing surface 228 is higher than an opening ratio of a central portion 228a of the opposing surface 228. In this specification, the central portion 228a of the opposing surface 228 is a region on the inner side of a line (broken line 229 in FIG. 7) connecting the midpoint of the radius of the opposing surface 228. Further, the outer peripheral portion 228b of the opposing surface 228 is a region on the outer side of the line (broken line 229 in FIG. 7) connecting the midpoint of the radius of the opposing surface 228, i.e., a region outside the central portion 228a. The opening ratio of the central portion 228a of the opposing surface 228 is a ratio of an area of the holes 226 in the central portion to an area of the central portion 228a of the opposing surface 228. The opening ratio of the outer peripheral portion 228b of the opposing surface 228 is a ratio of an area of the holes 226 in the outer peripheral portion to an area of the outer peripheral portion 228b of the opposing surface 228.

In the embodiment shown in FIG. 6 and FIG. 7, the plurality of holes 226 are formed only in the outer peripheral portion 228b of the opposing surface 228. That is, since the holes 226 are not formed in the central portion 228a of the opposing surface 228, the opening ratio of the central portion 228a of the opposing surface 228 is 0. On the other hand, a plurality of holes 226 are formed in the outer peripheral portion 228b of the opposing surface 228. Therefore, the opening ratio of the outer peripheral portion 228b of the opposing surface 228 is higher than the opening ratio of the central portion 228a of the opposing surface 228.

In this embodiment, the plurality of holes 226 include a first hole group 226a formed along the circumferential direction in the outer peripheral portion 228b of the opposing surface 228, a second hole group 226b formed along the circumferential direction on the outer side of the first hole group 226a in the radial direction of the opposing surface 228, and a third hole group 226c formed along the circumferential direction on the outer side of the second hole group 226b in the radial direction of the opposing surface 228. The second hole group 226b has a larger number of holes than the first hole group 226a, and the third hole group 226c has a larger number of holes than the second hole group 226b.

The gas supply member 222 may replace the air on the surface of the wafer W with the inert gas by supplying the inert gas to the wafer W via the plurality of holes 226 to suppress oxidation and corrosion of the surface of the wafer W. In particular, according to this embodiment, it is possible to suppress the supply amount of inert gas to efficiently suppress oxidation and corrosion of the surface of the wafer W. That is, as in the conventional art, in the case of supplying the inert gas to the entire surface of the wafer, when the wafer is transported in a direction along the surface of the wafer, e.g., when the transport apparatus turns while the hand holds the wafer, the inert gas supplied to the surface of the wafer is replaced by air in the moving direction, and the oxygen concentration tends to increase. In this regard, it is conceivable to supply a large amount of inert gas so that the inert gas on the wafer surface is not replaced by air, but it is economically unfavorable to use a large amount of inert gas. In addition, when a large amount of inert gas is supplied to the wafer surface, it is not preferable because the liquid film formed on the wafer surface may be blown off, which may instead lead to oxidation and corrosion of the wafer surface.

In contrast, in this embodiment, the plurality of holes 226 for supplying the inert gas are formed only in the outer peripheral portion of the opposing surface 228. Therefore, as shown in FIG. 6, the inert gas may be intensively supplied only to the outer peripheral portion of the wafer W. As a result, even though the amount of the inert gas supplied from the gas supply member 222 is small, a strong curtain of inert gas can be formed on the outer peripheral portion of the wafer W. Therefore, in the case where the cover member 220 is fixed to the hand 230, even if the horizontal drive mechanism 240 moves the hand 230 or the rotational drive mechanism 250 changes the orientation of the hand 230 in the horizontal plane to move the wafer W in the horizontal direction, since the inert gas on the surface of the wafer W is less likely to be replaced by the air in the moving direction, the oxygen concentration on the surface of the wafer W can be kept low. Further, in the case where the cover member 220 is fixed to the base 270, even if the rotational drive mechanism 250 changes the orientation of the hand 230 in the horizontal plane to move the wafer W in the horizontal direction, since the inert gas on the surface of the wafer W is less likely to be replaced by the air in the moving direction, the oxygen concentration on the surface of the wafer W can be kept low. Further, since the inert gas is sprayed only on the outer peripheral portion of the wafer W, it is less likely that the liquid film would be removed, at least on the central portion of the wafer W. As a result, oxidation and corrosion of the wafer W can be suppressed.

Further, in this embodiment, in the outer peripheral portion 228b of the opposing surface 228, since the three hole groups (the first hole group 226a, the second hole group 226b, and the third hole group 226c) are formed along the circumferential direction, a stronger curtain of inert gas can be formed on the outer peripheral portion of the wafer W. Further, since the second hole group 226b has a larger number of holes than the first hole group 226a, the holes of the second hole group 226b can be arranged at positions corresponding to spaces between the holes of the first hole group 226a. Similarly, since the third hole group 226c has a larger number of holes than the second hole group 226b, the holes of the third hole group 226c can be arranged at positions corresponding to spaces between the holes of the second hole group 226b. Therefore, even if the wafer W is moved in the horizontal direction, it is less likely that the air in the moving direction would enter the region on the surface of the wafer W, the oxygen concentration on the surface of the wafer W can be kept low, and as a result, oxidation and corrosion of the wafer W can be suppressed.

The gas supply member 222 may start supplying the inert gas with the cover member 220 and the wafer W being opposed to each other. In this case, the air on the outer peripheral portion of the surface of the wafer W is first replaced with the inert gas, and then the air on the central portion of the wafer W is gradually replaced with the inert gas. Further, the gas supply member 222 may also start supplying the inert gas before the cover member 220 and the wafer W are opposed to each other. For example, in the case where the cover member 220 is fixed to the hand 230, the gas supply member 222 may start supplying the inert gas when the hand 230 extends the arm member 234 and moves horizontally toward the wafer W to hold the wafer W. In this case, since the air on the surface of the wafer W can be swept out by the inert gas supplied from the plurality of holes 226 when the cover member 220 is moving along the surface of the wafer W, the air on the surface of the wafer W can be quickly replaced with the inert gas. Further, in the case where the cover member 220 is fixed to the base 270, the gas supply member 222 can start supplying the inert gas when the hand 230, which has extended the arm member 234 to hold the wafer W, contracts the arm member 234 and moves horizontally toward the lower region of the cover member 220. In this case, since the air on the surface of the wafer W can be swept out by the inert gas supplied from the plurality of holes 226 when the wafer W is moving along the opposing surface 228 of the cover member 220, the air on the surface of the wafer W can be quickly replaced with the inert gas.

In the above description, the first transport apparatus 209 has been described as the transport apparatus for the wafer W in the cleaning apparatus 4. However, the disclosure is not limited thereto, and the configurations of the cover member 220, the gas supply member 222, and the like may be applied to the transport apparatus (e.g., the first linear transporter 6 and the second linear transporter 7) configured to transport the wafer W processed by the polishing apparatus 3 or the cleaning apparatus 4.

Figure 8:
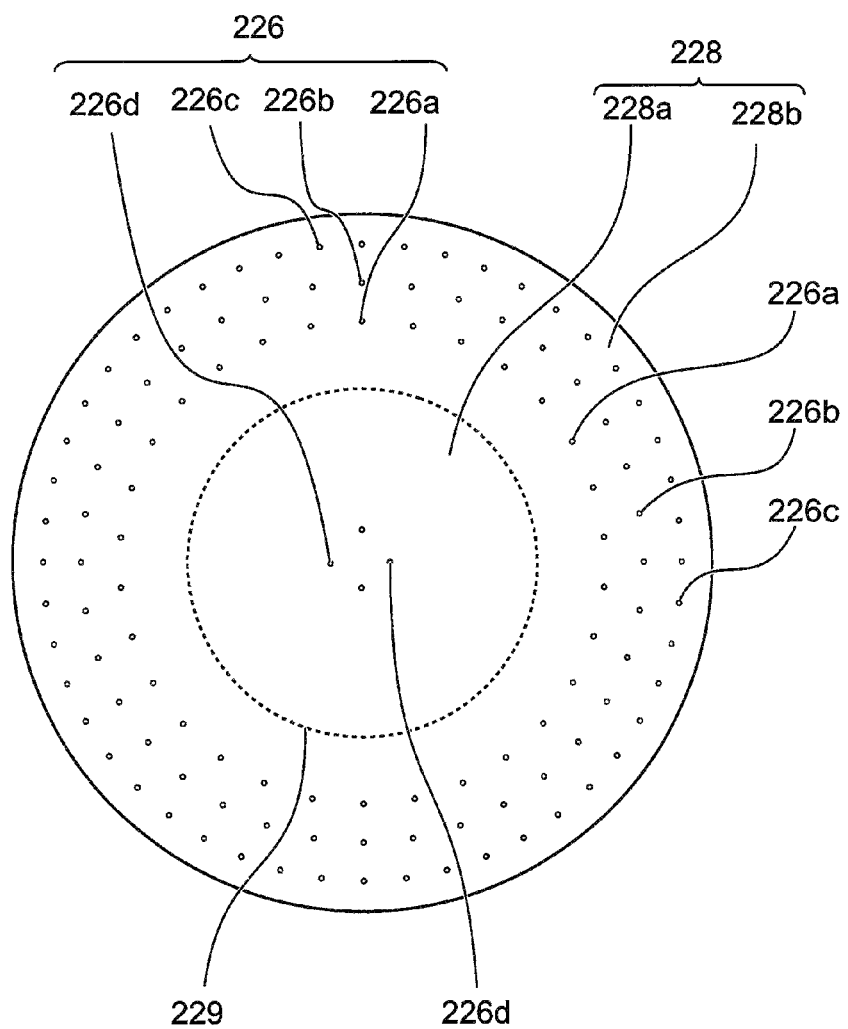
FIG. 8 is a view showing a modification example of a plurality of holes formed in the cover member.

Further, in the above embodiment, as an example, a plurality of holes 226 are formed only in the outer peripheral portion 228b of the opposing surface 228, but the disclosure is not limited thereto. FIG. 8 is a view showing a modification example of a plurality of holes formed in the cover member. As shown in FIG. 8, in addition to the first hole group 226a, the second hole group 226b, and the third hole group 226c formed in the outer peripheral portion 228b of the opposing surface 228, the plurality of holes 226 also include a fourth hole group (four holes) 226d formed in the central portion 228a of the opposing surface 228.

Even if the holes of the fourth hole group 226d are formed in the central portion 228a of the opposing surface 228 as in the modification example of FIG. 8, the opening ratio of the outer peripheral portion 228b of the opposing surface 228 is higher than the opening ratio of the central portion 228a of the opposing surface 228. Therefore, as in the above embodiment, since the inert gas can be intensively supplied to the outer peripheral portion of the wafer W, even though the amount of inert gas supplied from the gas supply member 222 is small, a strong curtain of inert gas can be formed on the outer peripheral portion of the wafer W. Therefore, even if the hand 230 is moved in the horizontal direction, it is less likely that the inert gas on the surface of the wafer W would be replaced by the air in the moving direction. Further, since the inert gas is mainly sprayed on the outer peripheral portion of the wafer W, it is less likely that the liquid film would be removed from the central portion of the wafer W, and oxidation and corrosion of the wafer W can be suppressed.

Although some embodiments of the disclosure have been described above, the above-described embodiments of the disclosure are intended to facilitate understanding of the disclosure and do not limit the disclosure. The disclosure may be modified and improved without departing from the spirit thereof, and obviously the disclosure includes such equivalents. In addition, as long as at least a part of the above-mentioned problems can be solved, or at least a part of the effects can be achieved, any combination or omission of components described in the claims and the specification is possible.

According to an embodiment of the disclosure, a transport apparatus includes a hand, a drive mechanism, a cover member, and a gas supply member. The hand is configured to hold a substrate. The drive mechanism is configured to transport the substrate by moving the hand. The cover member has an opposing surface opposed to a surface of the substrate held by the hand and is formed with a plurality of holes opened in the opposing surface. The gas supply member is configured to supply an inert gas to the surface of the substrate via the plurality of holes of the cover member. The plurality of holes are formed in the opposing surface so that an opening ratio of an outer peripheral portion of the opposing surface is higher than an opening ratio of a central portion of the opposing surface.

Further, according to an embodiment of the disclosure, in the transport apparatus, the plurality of holes are formed only in the outer peripheral portion of the opposing surface.

Further, according to an embodiment of the disclosure, in the transport apparatus, the opposing surface is formed in a circular shape corresponding to the surface of the substrate in a disk shape. The plurality of holes are formed along a circumferential direction in the outer peripheral portion of the opposing surface.

Further, according to an embodiment of the disclosure, in the transport apparatus, the plurality of holes include a first hole group formed along the circumferential direction in the outer peripheral portion of the opposing surface; and a second hole group which is formed along the circumferential direction on an outer side of the first hole group in a radial direction of the opposing surface and has a larger number of holes than the first hole group.

Further, according to an embodiment of the disclosure, the transport apparatus further includes a base configured to support the hand. The drive mechanism includes a horizontal drive mechanism configured to move the hand horizontally with respect to the base, an elevating drive mechanism configured to raise and lower the base, and a rotational drive mechanism configured to rotate the base to change an orientation of the hand in a horizontal plane. The cover member is fixed to the hand and is configured to move along with horizontal movement of the hand by the horizontal drive mechanism, ascending and descending movement of the hand by the elevating drive mechanism, and rotational movement of the hand by the rotational drive mechanism while keeping the opposing surface opposed to the surface of the substrate.

Further, according to an embodiment of the disclosure, the transport apparatus further includes a base configured to support the hand. The drive mechanism includes a horizontal drive mechanism configured to move the hand horizontally with respect to the base, an elevating drive mechanism configured to raise and lower the base, and a rotational drive mechanism configured to rotate the base to change an orientation of the hand in a horizontal plane. The cover member is fixed to the base and is configured to move along with ascending and descending movement of the hand by the elevating drive mechanism and rotational movement of the hand by the rotational drive mechanism while keeping the opposing surface opposed to the surface of the substrate.

Further, according to an embodiment of the disclosure, a substrate processing apparatus includes a polishing apparatus configured to polish a substrate, a cleaning apparatus configured to clean the substrate, and any transport apparatus described above configured to transport the substrate processed by the polishing apparatus or the cleaning apparatus.

What is claimed is:

1. A transport apparatus comprising:
    a hand configured to hold a substrate;
    a drive mechanism configured to transport the substrate by moving the hand;
    a cover member which has an opposing surface opposed to a surface of the substrate held by the hand and is formed with a plurality of holes opened in the opposing surface; and
    a gas supply member configured to supply an inert gas to the surface of the substrate via the plurality of holes of the cover member,
    wherein the plurality of holes are formed in the opposing surface such that a ratio of an area of the holes formed in an outer peripheral portion of the opposing surface to an area of the outer peripheral portion of the opposing surface is higher than a ratio of an area of the holes formed in a central portion of the opposing surface to an area of the central portion of the opposing surface.

2. The transport apparatus according to claim 1, wherein the plurality of holes are formed only in the outer peripheral portion of the opposing surface.

3. The transport apparatus according to claim 1, wherein the opposing surface is formed in a circular shape corresponding to the surface of the substrate in a disk shape, and
    the plurality of holes are formed along a circumferential direction in the outer peripheral portion of the opposing surface.

4. The transport apparatus according to claim 3, wherein the plurality of holes comprise:
    a first hole group formed along the circumferential direction in the outer peripheral portion of the opposing surface; and
    a second hole group which is formed along the circumferential direction on an outer side of the first hole group in a radial direction of the opposing surface and has a larger number of holes than the first hole group.

5. The transport apparatus according to claim 1, further comprising a base configured to support the hand,
    wherein the drive mechanism comprises a horizontal drive mechanism configured to move the hand horizontally with respect to the base, an elevating drive mechanism configured to raise and lower the base, and a rotational drive mechanism configured to rotate the base to change an orientation of the hand in a horizontal plane, and
    the cover member is fixed to the hand and is configured to move along with horizontal movement of the hand by the horizontal drive mechanism, ascending and descending movement of the hand by the elevating drive mechanism, and rotational movement of the hand by the rotational drive mechanism while keeping the opposing surface opposed to the surface of the substrate.

6. The transport apparatus according to claim 1, further comprising a base configured to support the hand,
    wherein the drive mechanism comprises a horizontal drive mechanism configured to move the hand horizontally with respect to the base, an elevating drive mechanism configured to raise and lower the base, and a rotational drive mechanism configured to rotate the base to change an orientation of the hand in a horizontal plane, and
    the cover member is fixed to the base and is configured to move along with ascending and descending movement of the hand by the elevating drive mechanism and rotational movement of the hand by the rotational drive mechanism while keeping the opposing surface opposed to the surface of the substrate.

7. A substrate processing apparatus comprising:
    a polishing apparatus configured to polish a substrate;
    a cleaning apparatus configured to clean the substrate; and
    the transport apparatus according to claim 1, configured to transport the substrate processed by the polishing apparatus or the cleaning apparatus.

* * * * *